United States Patent [19]

Scibora

[11] Patent Number: 6,122,230
[45] Date of Patent: Sep. 19, 2000

[54] UNIVERSAL COMPRESSED AUDIO PLAYER

[75] Inventor: Marco Scibora, St. Paul, Minn.

[73] Assignee: Advanced Communication Design, Inc., Bloomington, Minn.

[21] Appl. No.: 09/304,942

[22] Filed: May 4, 1999

Related U.S. Application Data

[63] Continuation-in-part of application No. 09/247,713, Feb. 9, 1999.

[51] Int. Cl.$^7$ .................................................. G11B 17/22
[52] U.S. Cl. ................................................ 369/32; 369/48
[58] Field of Search .................................. 369/33, 32, 47, 369/48, 59, 1, 7

[56] References Cited

U.S. PATENT DOCUMENTS

| | | |
|---|---|---|
| 5,177,728 | 1/1993 | Otsubo . |
| 5,228,021 | 7/1993 | Sato . |
| 5,418,713 | 5/1995 | Allen . |
| 5,428,592 | 6/1995 | Endo .......................................... 369/48 |
| 5,566,379 | 10/1996 | Mawatari et al. ......................... 360/48 |
| 5,617,386 | 4/1997 | Choi .......................................... 369/32 |
| 5,687,279 | 11/1997 | Matthews ................................ 704/201 |
| 5,999,505 | 12/1999 | Yasui ......................................... 369/48 |

*Primary Examiner*—Tan Dinh
*Attorney, Agent, or Firm*—Rider Bennett Egan & Arundel

[57] ABSTRACT

A universal compressed audio player having the ability to decode and play an encoded audio file residing in a music storage, regardless of the particular encoding algorithm used to encode the audio file, consists of: a music storage containing a compressed audio file to be decoded; a programmable digital signal processor adapted to decode the compressed audio file under the direction of a decoding software program; a nonvolatile memory containing the decoding software program directing the operation of the digital signal processor; a program adapted to copy the decoding software program from a memory card into the nonvolatile memory; a digital-to-analog converter to convert the decoded signal into an analog audio signal; and a speaker or headphones to convert the analog audio signal into sound.

17 Claims, 2 Drawing Sheets

UNIVERSAL COMPRESSED AUDIO PLAYER

This is a continuation-in-part of co-pending U.S. patent application Ser. No. 09/247,713, filed Feb. 9, 1999, and titled UNIVERSAL CD PLAYER.

BACKGROUND OF THE INVENTION

The present invention relates to a universal compact disc (CD) player that allows either portable battery powered or standard AC powered operation to decode any digital audio file from a CD.

Today, all CD players allow decoding (playing) of only the standard CDDA digital format, which is used by all music record manufacturers ("labels").

However, in recent years, various compression schemes and digital delivery of audio files have been designed to accommodate efficient music delivery over digital networks such as the Internet with concomitant savings in storage space on CDs, personal computer hard drives, etc. The advantage of such compression schemes may be illustrated in the following table, which shows the time needed to transmit a high-quality, three-minute audio file:

| Compression | Year of First Use | Maximum modem speed (kbps) | Transmission Time |
| --- | --- | --- | --- |
| 2x | 1991 | 2.4 | 14 hrs |
| 11x | 1997 | 28.8 | 13 min. |
| 16x | 2003 (est.) | 400.0 | 38 sec. |

As can be seen, the availability of highly efficient compression schemes and very high bandwidth transmission facilities will result in the ability for an individual to download a high-quality musical piece in a very acceptable time period. Therefore, it is predicted that electronic sales of music and entertainment products via the Internet, proprietary online services, CD-Rom, interactive television, kiosks and screen phones will quintuple to $186 million by the year 2000 (conservatively) or to as much as $1.3 billion, or 10 percent of the industry total.

There is therefore a fierce battle over which compression scheme will be adapted as a standard for the music industry. At present, there are at least four agencies claiming to be the mainstream of the music industries. In addition, a number of studies are under way on new compression schemes. The four types of compression schemes currently dominating the market place are:

(1) Moving Picture Experts Group (MPEG): a standard compression scheme for coding of moving pictures and associated audio for digital storage media at up to 1.5 megabits/sec (Mbps). This is an international standard of the International Organisation for Standardisation (ISO), in 5 parts (ISO/IEC 11172-1 through-5). MPEG players (see below) are freely distributed over the Internet to millions of computer users.

(2) Real Audio: a compression scheme for coding both video and audio for streaming transmission and download over the Internet. This compression scheme was designed by Progressive Networks (now RealNetworks) and has perhaps the largest market share of any of the proprietary schemes. RealNetworks freely distributes a player over the Internet to anyone who wants it.

(3) Liquid Audio: another proprietary compression scheme for audio and associated lyrics, credits and artwork contained in a single audio file. This compression scheme also uses Dolby Digital encoding to increase the quality of the audio. Like RealNetworks, Liquid Audio provides a free player.

(4) A2b: another proprietary transmission scheme developed by AT&T.

Generally speaking, all of these compression schemes have the following components:

(1) a player, which is required to listen to streaming audio or to play any digital file that resides on a hard disk. The player decompresses the music files, which were previously compressed; and (2) a decoder to decompress and decode the compressed audio.

A great number of encoders exist (even within a given compression scheme such as MPEG). However, all encoders involve some mathematical algorithm which examines the audio stream and removes "redundant" information which cannot be distinguished by the human ear. For example, an audio CD holds about 60 to 72 minutes of 16 bit, 44.1 kHz raw audio data, for a total of about 650 Mbytes of data. The classic way to reduce the size of the data is to reduce the sampling rate from 44.1 kHz to 22 kHz, or to convert 16 bit samples to 8 bit samples. Unfortunately, a simple method such as this results in losing about half the quality of the audio.

Encoders involve sophisticated mathematical processing to reduce the size of the audio file without a one-for-one reduction in quality. Based on research of human perception, the encoder decides what information is elementary and what can be stripped. For example, in MPEG the audio encoder removes a weaker signal that follows a strong signal, because the weaker signal would not be recognized by the brain even if allowed to pass to the ear. The higher the compression, the more information is stripped, and the more likely that the listener will perceive a difference in audio quality.

Decoders use sophisticated mathematical processing to decompress the encoded audio file. The sophisticated mathematical processing used by a decoder may be carried out by any computer. Today, thousands of people are downloading MPEG files over the Internet and decoding them using free players which use the microprocessor of the personal computer, in conjunction with a "sound card", to implement the decoder. But these people, and others, also want the ability to play these compressed files in a portable device. No flexible means of compressed music playback without the use of a computer exists at present.

There is therefore a need for a universal CD player that can decode and play a compressed audio file that was encoded by any encoder. The present invention provides such a solution through the use of digital signal processing (DSP) technology integrated into a CD player's decoder.

In another aspect of the present invention, there is provided a universal compressed audio player that can decode and play a compressed audio file that was encoded by any encoder. The compressed audo file can reside in any storage accessible to the player, including internal random access memory (RAM) or removable memory such as a memory card.

SUMMARY OF THE INVENTION

A universal compact disc (CD) player having the ability to decode and play an encoded audio file residing on a CD, regardless of the particular encoding algorithm used to encode the audio file, consists of: a spindle motor and optical pickup adapted to read the signal recorded on the CD; an amplifier to amplify the signal read by the pickup; a programmable digital signal processor adapted to decode the amplified signal under the direction of a decoding software program; a nonvolatile memory containing the decoding software program directing the operation of the digital signal processor; a program adapted to copy the decoding software program from a memory card into the nonvolatile memory; a digital-to-analog converter to convert the decoded signal into an analog audio signal; and a speaker or headphones to convert the analog audio signal into sound.

A universal compressed audio player having the ability to decode and play an encoded audio file residing in a music storage, regardless of the particular encoding algorithm used to encode the audio file, consists of: a music storage containing a compressed audio file to be decoded; a programmable digital signal processor adapted to decode the compressed audio file under the direction of a decoding software program; a nonvolatile memory containing the decoding software program directing the operation of the digital signal processor; a program adapted to copy the decoding software program from a memory card into the nonvolatile memory; a digital-to-analog converter to convert the decoded signal into an analog audio signal; and a speaker or headphones to convert the analog audio signal into sound.

A principal object and advantage of the present invention is that it can decode and play an audio file on a CD which was encoded by any of a number of different encoding schemes.

Another principal object and advantage of the present invention is that it can decode and play an audio file residing in a music storage, the audio file having been encoded by any of a number of different encoding schemes.

Another principal object and advantage of the present invention is that it can decode and play compressed audio files without the need for a personal computer.

Another principal object and advantage of the present invention is that it provides a completely portable means for playing compressed audio files.

Another principal object and advantage of the present invention is that it can play standard (uncompressed) CDs.

Another principal object and advantage of the present invention is that it accepts any decoding software program which could be downloaded from an external memory card.

Another principal object and advantage of the present invention is that it allows a copy indicator such as a unique serial number for each player which prevents the use of a purchased memory card on another player, thus protecting manufacturers' copyrights in the decoding software.

DETAILED DESCRIPTION OF PREFERRED EMBODIMENT

Figure 1:
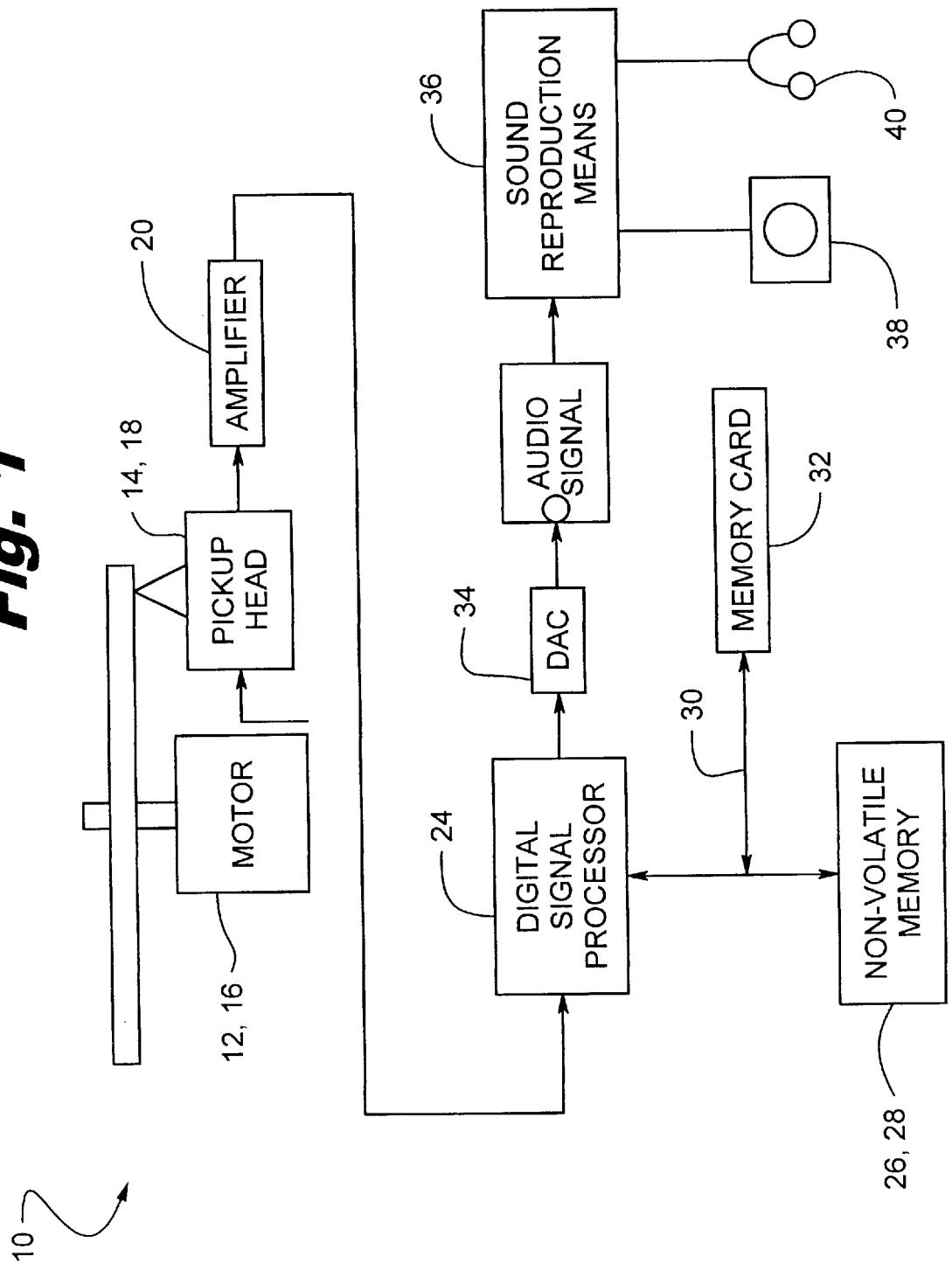
FIG. 1 is a block diagram of the universal CD player of the present invention.

A block diagram of the universal CD player of the present invention is shown in FIG. 1 and is generally referenced as reference numeral 10.

The universal CD player 10 comprises a drive means 12 for spinning a CD and an optical sensing means 14 for reading the signal encoded on the CD. In the preferred embodiment, the drive means 12 comprises a spindle motor 16 and the optical sensing means 14 comprises an optical pickup 18.

The universal CD player 10 further comprises a signal amplifier 20 for amplifying the signal read by the optical sensing means 14 and producing an amplified signal.

The amplified signal from the amplifier 20 is fed into a programmable digital signal processor (DSP) 24. DSPs are readily available from a large number of sources, one example being the Butterfly DSP from SHARP Microelectronics, 5700 NW Pacific Rim Blvd., Camas, Wash. 98607. Herein, the DSP is "programmable" when its operation is directed by a decoding software program, as will be described below. This distinguishes the element from single-purpose chips such as the MPEG decoder chip disclosed in U.S. Pat. No. 5,617,386 and the single-purpose signal processor disclosed in U.S. Pat. No. 5,428,592.

The DSP 24 is adapted to decode the amplified signal under the direction of a decoding software program.

The universal CD player 10 further comprises at least one decoding software program directing the operation of the DSP 24. This decoding software program is stored in a memory means 26. The memory means 26 is preferably a nonvolatile memory 28, which retains its contents in the absence of external power and is readable and writable.

The universal CD player 10 further comprises a means 30 for copying the decoding software program into the memory means 26 from an external source. Preferably, the means 30 reads a memory card 32 inserted into the universal CD player 10. The means 30 may be the DSP 24 or a separate processor.

The universal CD player 10 further comprises a digital-to-analog converter (DAC) 34 to convert the decoded signal into an analog audio signal.

The universal CD player 10 further comprises sound reproduction means 36 for converting the analog audio signal to sound. The sound reproduction means 36 may be a speaker 38 or earphone 40.

To prevent unauthorized use of the decoding software program, the universal CD player 10 may preferably include a noneraseable copy indicator (not shown), preferably stored in the nonvolatile memory 28, and adapted to be transferred to the memory card 32, as will be discussed below. In the preferred embodiment, the copy indicator is a serial number unique to each instance of the universal CD player 10.

Operation of the universal CD player 10 is as follows.

The universal CD player 10 may be manufactured with the nonvolatile memory 28 containing a decoding software program for standard CDDA encoding (used on all standard CD players). Additionally, the nonvolatile memory 28 may initially contain a decoding software program for MPEG. Therefore, the user will be able to play standard CD (CDDA) recordings without purchasing any memory cards. The user will also be able to play MPEG recordings.

All other licensed formats of compression schemes (such as RealAudio, Liquid Audio, and a2b) will require the user to purchase them pre-loaded on a memory card. Each memory card (available through any retail outlet) will have the decoding software on it. When the memory card 32 is inserted into the CD player 10, the decoding software program will be transferred to the nonvolatile memory 28 and the user will then be able to play CDs with audio files encoded with that particular compression scheme.

Additionally, the universal CD player may implement copyright protection for the decoding software as follows.

When the memory card 32 is inserted in the CD player 10, the nonerasable copy indicator will be transferred from the nonvolatile memory 28 to the memory card 32 at a hidden location on the memory card. If the memory card is removed from the CD player 10 and inserted into another CD player 10, the second CD player will not allow the decoding software to load because the copy indicator in the second CD player does not match the copy indicator on the memory card. Since all decoding software licenses are based on a per player basis, this design protects the decoder's copyrights. If and when licensing issues no longer apply, a memory card upgrade will be available to do away with the copy indicator licensing protection.

Figure 2:
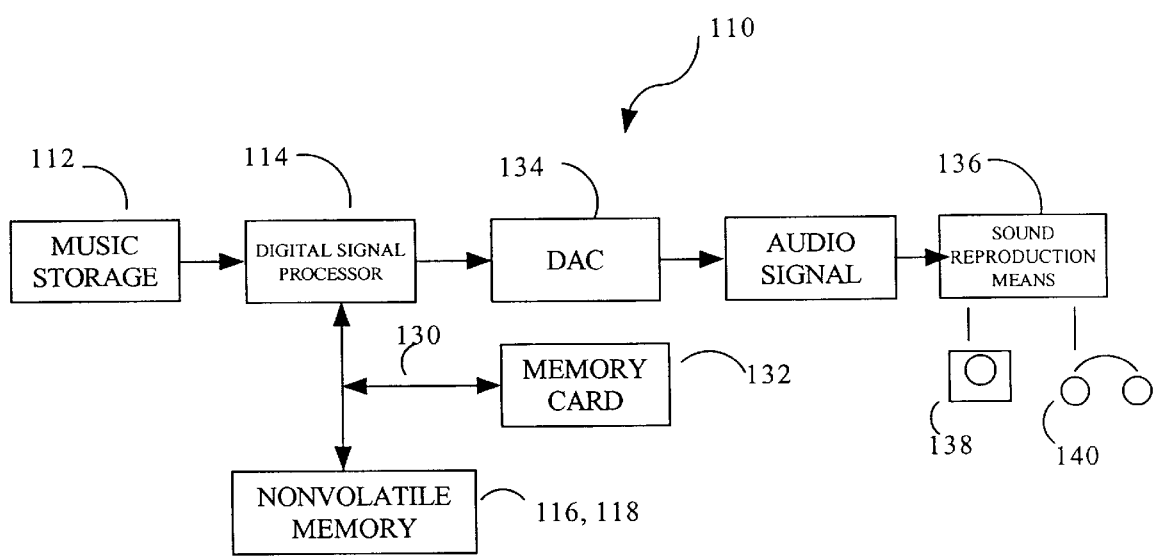
FIG. 2 is a block diagram of the universal compressed audio player of the present invention.

In another aspect of the present invention, a universal compressed audio player is shown in FIG. 2 as reference numeral 110.

The universal compressed audio player 10 further comprises a music storage 112 containing a compressed audio file to be decoded. The compressed audio file may have been encoded by any digital compression scheme, including, without limitation, MPEG, Real Audio, Liquid Audio, and A2b.

The universal compressed audio player 10 further comprises a programmable digital signal processor (DSP) 114. DSPs are readily available from a large number of sources, one example being the Butterfly DSP from SHARP Microelectronics, 5700 NW Pacific Rim Blvd., Camas, Wash. 98607. Herein, the DSP is "programmable" when its operation is directed by a decoding software program, as will be described below. This distinguishes the element from single-purpose chips such as the MPEG decoder chip disclosed in U.S. Pat. No. 5,617,386 and the single-purpose signal processor disclosed in U.S. Pat. No. 5,428,592.

The universal compressed audio player 110 further comprises at least one decoding software program directing the operation of the DSP 114. This decoding software program is stored in a memory means 116. The memory means 116 is preferably a nonvolatile memory 118, which retains its contents in the absence of external power and is readable and writable.

The universal compressed audio player 110 further comprises a means 130 for copying the decoding software program into the memory means 116 from an external source. Preferably, the means 130 reads a memory card 132 inserted into the universal compressed audio player 110. The means 130 may be the DSP 114 or a separate processor.

The universal compressed audio player 110 further comprises a digital-to-analog converter (DAC) 134 to convert the decoded signal into an analog audio signal.

The universal compressed audio player 110 further comprises sound reproduction means 136 for converting the analog audio signal to sound. The sound reproduction means 136 may be a speaker 138 or earphone 140.

To prevent unauthorized use of the decoding software program, the universal compressed audio player 110 may preferably include a noneraseable copy indicator (not shown), preferably stored in the nonvolatile memory 118, and adapted to be transferred to the memory card 132, as will be discussed below. In the preferred embodiment, the copy indicator is a serial number unique to each instance of the universal compressed audio player 110.

Operation of the universal compressed audio player 110 is as follows.

The universal compressed audio player 110 may be manufactured with the nonvolatile memory 118 containing a decoding software program for standard CDDA encoding (used on all standard CD players). Additionally, the nonvolatile memory 118 may initially contain a decoding software program for MPEG. Therefore, the user will be able to play standard CD (CDDA) recordings without purchasing any memory cards. The user will also be able to play MPEG recordings.

All other licensed formats of compression schemes (such as RealAudio, Liquid Audio, and a2b) will require the user to purchase them pre-loaded on a memory card. Each memory card (available through any retail outlet) will have the decoding software on it. When the memory card 132 is inserted into the player 110, the decoding software program will be transferred to the nonvolatile memory 118 and the user will then be able to play CDs with audio files encoded with that particular compression scheme.

Additionally, the universal compressed audio player may implement copyright protection for the decoding software as follows. When the memory card 132 is inserted in the player 110, the nonerasable copy indicator will be transferred from the nonvolatile memory 118 to the memory card 132 at a hidden location on the memory card. If the memory card is removed from the player 110 and inserted into another player 110, the second player will not allow the decoding software to load because the copy indicator in the second player does not match the copy indicator on the memory card. Since all decoding software licenses are based on a per player basis, this design protects the decoder's copyrights. If and when licensing issues no longer apply, a memory card upgrade will be available to do away with the copy indicator licensing protection.

The present invention may be embodied in other specific forms without departing from the spirit or essential attributes thereof; therefore, the illustrated embodiments should be considered in all respects as illustrative and not restrictive, reference being made to the appended claims rather than to the foregoing description to indicate the scope of the invention.

What is claimed:

1. A universal compressed audio player for decoding and playing an encoded audio file residing in a music storage, regardless of the particular encoding algorithm used to encode the audio file, the player comprising:
   (a) a music storage containing a compressed audio file to be decoded;
   (b) a programmable digital signal processor adapted to decode the compressed audio file under the direction of a decoding software program, producing a decoded signal;
   (c) at least one decoding software program directing the operation of the digital signal processor;
   (d) memory means for storing the decoding software program;
   (e) means for reading the decoding software program into the memory means from an external memory; and
   (f) a digital-to-analog converter to convert the decoded signal into an analog audio signal.

2. The universal compressed audio player of claim 1, further comprising a nonerasable copy indicator adapted to be transferred to a memory card from the memory means.

3. The universal compressed audio player of claim 2, wherein the nonerasable copy indicator is a serial number.

4. The universal compressed audio player of claim 1, wherein the memory means is nonvolatile and initially contains a decoding software program adapted to decode CDDA encoding.

5. The universal compressed audio player of claim 4, wherein the memory means is nonvolatile and initially contains a decoding software program adapted to decode MPEG encoding.

6. A universal compressed audio player for decoding and playing an encoded audio file residing in a music storage, regardless of the particular encoding algorithm used to encode the audio file, the player comprising:

(a) a music storage containing a compressed audio file to be decoded;

(b) a programmable digital signal processor adapted to decode the compressed audio file under the direction of a decoding software program, producing a decoded signal;

(c) at least one decoding software program directing the operation of the digital signal processor;

(d) a nonvolatile memory containing the decoding software program directing the operation of the digital signal processor;

(e) means for reading the decoding software program from a memory card into the nonvolatile memory;

(f) a digital-to-analog converter to convert the decoded signal into an analog audio signal; and (g) sound reproduction means to for converting the analog audio signal into sound.

7. The universal compressed audio player of claim 6, further comprising a nonerasable copy indicator adapted to be transferred to a memory card.

8. The universal compressed audio player of claim 6, wherein the sound reproduction means is a speaker.

9. The universal compressed audio player of claim 6, wherein the sound reproduction means is an earphone.

10. The universal compressed audio player of claim 6, wherein the nonvolatile memory initially contains a decoding software program adapted to decode CDDA encoding.

11. The universal compressed audio player of claim 10, wherein the nonvolatile memory further comprises a decoding software program adapted to decode MPEG.

12. A universal compressed audio player for decoding and playing an encoded audio file residing in a music storage, regardless of the particular encoding algorithm used to encode the audio file, the player comprising:

(a) a music storage containing a compressed audio file to be decoded;

(b) a programmable digital signal processor adapted to decode the compressed audio file under the direction of a decoding software program, producing a decoded signal;

(c) at least one decoding software program directing the operation of the digital signal processor;

(d) a nonvolatile memory containing the decoding software program directing the operation of the digital signal processor;

(e) means for reading the decoding software program from a memory card into the nonvolatile memory;

(f) a digital-to-analog converter to convert the decoded signal into an analog audio signal;

(g) sound reproduction means to for converting the analog audio signal into sound; and (h) a noneraseable copy indicator adapted to be transferred to a memory card.

13. The universal compressed audio player of claim 12, wherein the sound reproduction means is a speaker.

14. The universal compressed audio player of claim 12, wherein the sound reproduction means is an earphone.

15. The universal compressed audio player of claim 12, wherein the nonvolatile memory initially contains a decoding software program adapted to decode CDDA encoding.

16. The universal compressed audio player of claim 15, wherein the nonvolatile memory further comprises a decoding software program adapted to decode MPEG.

17. The universal compressed audio player of claim 12, wherein the copy indicator is a serial number.

\* \* \* \* \*